United States Patent [19]

D'Agostino et al.

[11] Patent Number: 4,869,922
[45] Date of Patent: Sep. 26, 1989

[54] METHOD OF COATING WITH POLYFLUOROCARBONS

[75] Inventors: Riccardo D'Agostino; Francesco Cramarossa, both of Bari; Francesco Fracassi, Triggiano; Francesca Illuzzi, Giovinazzo; Gerardo Caporiccio, Milan, all of Italy

[73] Assignee: Ausimont S.p.A., Milan, Italy

[21] Appl. No.: 235,054

[22] Filed: Aug. 23, 1988

Related U.S. Application Data

[62] Division of Ser. No. 6,173, Jan. 23, 1987, Pat. No. 4,791,012.

[51] Int. Cl.$^4$ ............................................. B05D 3/06
[52] U.S. Cl. ...................................... 427/38; 427/44
[58] Field of Search ................................... 427/38, 44

Primary Examiner—Bernard Pianalto

Attorney, Agent, or Firm—Stevens, Davis, Miller & Mosher

[57] ABSTRACT

Films, layers, tapes, plates, and similar structures of metal or of plastic materials, coated with thin polyfluorocarbon films. These films, tapes, etc., are characterized in that no other materials are interposed; the polyfluorocarbon films are adherent and not porous, and have controlled wettability characteristics. The polyfluorocarbons have the formula $(CF_x)_n$, wherein x is within the range of from 0.3 to 2.0, and are directly obtained on the substrate by the plasma-polymerization of gaseous streams of $C_2F_6$ and $H_2$; $C_2F_6$ and $C_2F_4$; $CF_4$ and $H_2$; $CF_4$ and $C_2F_4$; or of $C_2F_4$. The metal substrate may be, e.g., Al, Cu, Fe, tin-coated Fe, Si, noble metals and alloys thereof. The substrate of plastic materials may be constituted, e.g., by polytetrafluoroethylene, polypropylene, polyethylene, polyphenyloxide, polycarbonate, and neoprene.

5 Claims, 1 Drawing Sheet

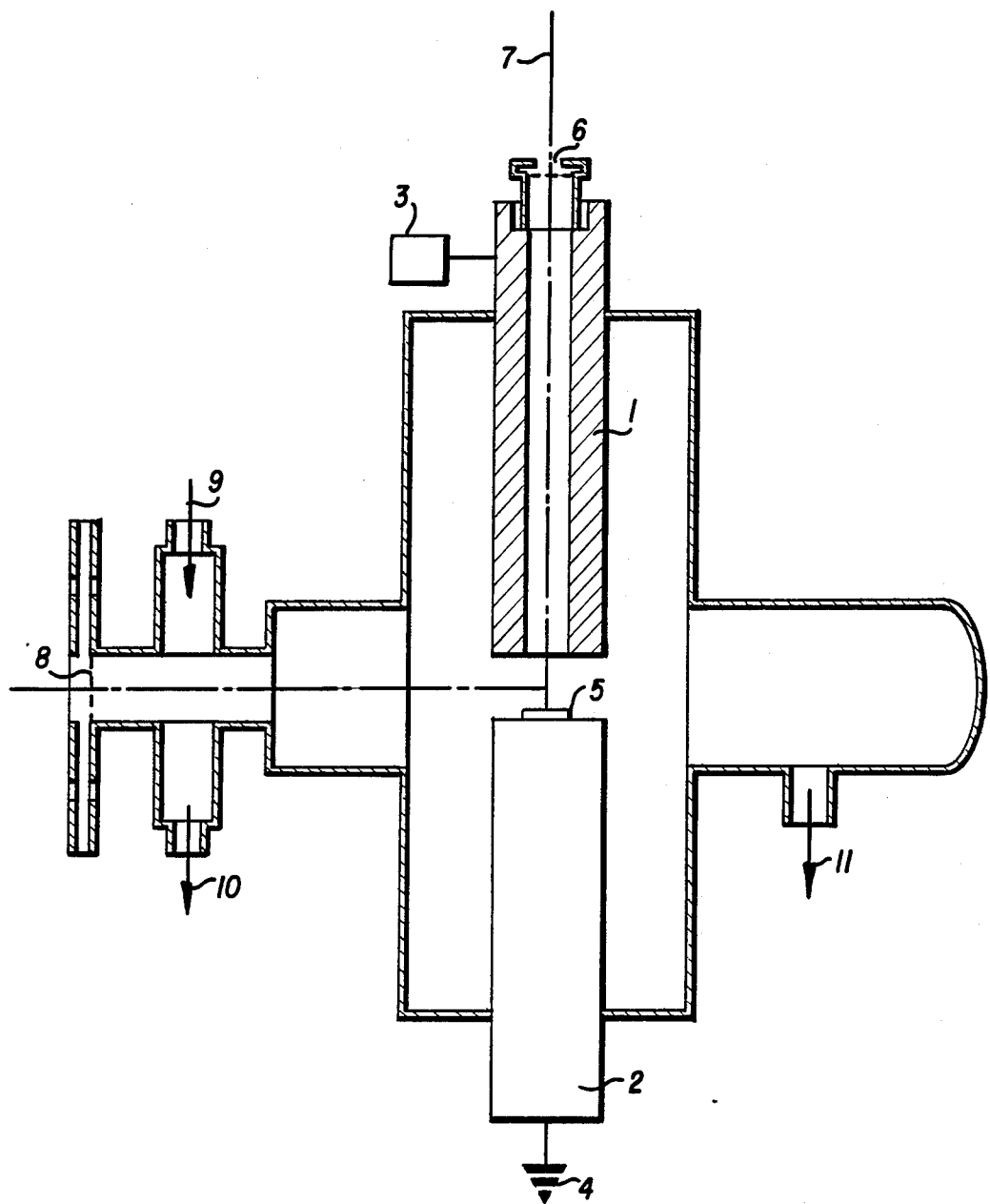

METHOD OF COATING WITH POLYFLUOROCARBONS

This is a division of application Ser. No. 006,173 filed Jan. 23, 1987 now U.S. Pat. No. 4,791,012.

DESCRIPTION OF THE INVENTION

This invention relates to films, layers, tapes, plates, and similar structures of metal or of plastic materials coated with thin polyflourocarbon films. More precisely, it relates to such films, layers, etc., coated with thin, adherent and nonporous films of polyfluorocarbons, with no other materials being interposed, and the wettability of which may be controlled as desired from practically null values, which guarantee, e.g., impermeability and passivating properties in respect of the substrate, to values useful for different treatments, such as e.g., the bonding to other materials, and the deposition of metals by chemical methods.

It is well known that a non-porous coating of polytetrafluoroethylene cannot be directly applied onto a substrate of metal or of plastic material. According to a known process, the polytetrafluoroethylene film must previously undergo a cementation process, which can be obtained by means of the chemical attack of the film with a solution of sodium napthalene in tetrahydrofuran, or with a solution of sodium amide in liquid ammonia; the surface of the polymer is thus so altered as to render it wettable by a bonding agent of epoxy type, which allows the polymer to be bonded onto the substrate. The use of these cementation solutions is not easy and causes problems of environmental hygiene. In the case of the sodium naphthalene solution, the process must be carried out in an inert medium, usually in dry nitrogen. Moreover, the films obtained must be immediately treated with the epoxy bonding agent, before their desirable properties can deteriorate.

Another method is also known for producing coatings of films of polytetrafluoroethylene on metal substrates: the substrate is painted with an aqueous emulsion of the polykmer. A drying and a high temperature (380°–44020 C.) sintering follow. This method requires a burdensome preliminary metal pickling procedure, e.g., by concentrated HCl, or with abrasive means. In many cases, however, the adhesion to the substrate is not sufficient; for this reason, it is necessary to admix with the polymer emulsion ingredients able to bind the polymer to the substrate. In such cases, the polytetrafluoroethylene film is endowed with a lower chemical and thermal resistance owing to the presence of the added ingredients. Furthermore, such ingredients may cause toxicity problems.

An object of the present invention is to provide films, layers, sheets, tapes, plates, and similar shaped structures of metal or of plastic materials, coated with thin polyfluorocarbon films, with no other materials being interposed, which are endowed with very good adherence to the substrate, freedom from porosity, and which have controlled wettability characteristics.

Another object is to provide a process for producing said thin films which overcomes the drawbacks of the prior art.

The first object is achieved by the films, layers, tapes, plates, and similar structures of metal or of plastic materials of the present invention, coated with thin films of polyfluorocarbons. These films, layers, etc., are characterized in that no other materials are interposed; the polyfluorocarbon films are adherent and non-porous, and have controllable wettability characteristics. The polyfluorocarbons have the formula $(CF_x)_n$, wherein x is within the range of from 0.3 to 2.0 and are obtained by the plasmapolymerization of gaseous streams of $C_2F_6$ and $H_2$; $C_2F_6$ and $C_2F_4$; $CF_4$ and $H_2$; $CF_4$ and $C_2F_4$; or of $C_2F_4$.

The metal substrates may be, e.g., Al, Cu, Fe, tin-coated Fe, Si, noble metals and alloys such as steel and brass. A particularly preferred metal substrate is aluminum.

The polymeric substrate may be constituted, e.g., by polytetrafluoroethylene, polypropylene, polyethylene, polyphenyloxide, polycarbonates and neoprene. A particularly preferred polymeric substrate is polytetrafluoroethylene.

The polyfluorocarbons having the formula $(CF_x)_n$ are known, and are obtained by the plasma-polymerization of gaseous streams of $C_2F_4$ or of freons with $H_2$. They are described, e.g., in the papers by E. Kay, J. Coburn and A. Dilks in "Topics in Current Chemistry", III, Springer-Verlag, Verlin 1980, page 1; N. Morosoff, H. Yasuda, E.S. Brandt, C.N. Reilly in J. Appl. Polym. Sci., 23, 1003 (1979); ibidem 23, 3449 (1979); ibidem 23, 3471 (1979); R. d'Agostino, P. Capezzuto, G. Bruno, F. Cramarossa in Pure and Applied Chemistry, 57, 1287 (1985).

When x is close to 2, the polymers have a structure resembling that of polytetrafluoroethylene. When x is close to 0.3, numerous crosslinks exist in the polymer.

The adherence of the film to the substrate is very good: for example, it has values usually within the range of from 30 to 50 kg/cm$^1$ when the substrate is aluminum; and, when the substrate is polytetrafluoroethylene, of from 10 to 30 kg/cm$^2$.

The wettability, measured as $\gamma_c$ (critical surface tension) is usually within the range of from 18 to 40 dynes.cm$^{-1}$. Values of $\gamma_c$ within the range of from 18 to 22 correspond to a practically null wettability, and are obtained with polyfluorocarbons $(CF_x)_n$ wherein x is within the range of from about 1.7 to 2. Values of $\gamma_c$ within the range of from 23 to 40 correspond to properties of partial or complete wettability, suitable for further treatments of the structure, such as, e.g., the bonding to other materials, and are obtained with polyfluorocarbons $(CF_x)_n$ wherein x is within the range of from 0.3 to 1.4.

Also the non-wettable coatings can be bonded to other materials, with the aid of epoxy resins.

The thickness of the polyfluorocarbon film is usually within the range of from 100 Å to 3 microns.

Particularly interesting from the application viewpoint are the substrates of metals coated with non-wettable polyfluorocarbon films, and substrates of non-wettable polymers coated with films of wettable polyfluorocarbons. Examples of "non-wettable polymers" are polytetrafluoroethylele, polypropylene, polyethylene, polyphenyloxide, polycarbonates and neoprene.

In the first case, the metal substrates are coated with polyfluorocarbons $(CF_x)_n$ wherein x is within the range of from about 1.7 to 2.0, and having a critical surface tension within the range of from 18 to 22. Metal structures were impermeable, passivating, insulating coatings are thus obtained. An interesting application of such coated structures is constituted by bags for the vacuum-preservation of coffee, made of aluminum films coated with polyfluorocarbons having such characteristics. The thickness of the polyfluorocarbon coating in such bags is generally between 0.5 to 2 microns.

In the second case, the substrates of non-wettable polymers are coated with polyfluorocarbons $(CF_x)_n$, wherein n is within the range of from 0.3 to about 1.4, and having a critical surface tension within the range of from about 23 to about 34 dynes.cm$^{-1}$. On these coated structures, applying, e.g., writings, colors or depositing metals is possible. The same coated structures may also be bonded by means of a conventional bonding agent onto other surfaces, for exmaple of metals, or rubbers or technopolymers.

Another object of the present invention is to provide a process for coating films, layers, tapes, plates, and similar structures of metal or of plastic materials with a thin film of the above said polyfluorocarbons. This process is characterized in that a gaseous stream of $C_2F_6$ and $H_2$; $C_2F_6$ and $C_2F_4$; $CF_4$ and $H_2$; $CF_4$ and $C_2F_4$; or of $C_2F_4$, is passed through a reactor equipped with two electrodes, one of which is connected to a radio-frequency current generator, the other one being grounded; the substrate is placed on one of the electrodes; the pressure of the gaseous stream is within the range of from 0.1 to 2 torr; a power density of at least 1 watt/cm$^2$ is applied, causing in such a way the formation of the plasma, as well as the consequent polymerization of the fluorocarbons directly on the substrate, the temperature of which is maintained at values within the range of from 20° to 120° C.

The substrate temperature may be maintained at the above values thanks to the circulation inside the electrodes of a liquid coming from a temperature control unit.

The power density is preferably within the range of from 1 to 10 watt/cm$^2$. The two electrodes are preferably parallel to each other.

The temperature of the substrate is preferably kept at values within the range of from 40° to 100° C.

These preferred conditions allow very high polymerization rates to be obtained, of up to 0.3–0.4 microns per minute.

BRIEF DESCRIPTION OF THE DRAWING

The drawing shows a reactor apparatus for carrying out the plasma-polymerization of the gaseous streams.

By referring to the accompanying drawing, equipment suitable for practically carrying out the process of the present invention will be described for purposes of exemplification.

The reactor, made of pyrex glass, is provided with two inner parallel-plate electrodes 1 and 2. The potential-fed electrode is the upper electrode 1, connected to a radio frequency generator 3. The other electrode 2 is grounded at 4. The electrodes are temperature controlled by the circulation of a liquid mixture coming from a conventional temperature controller unit, not shown in the drawing. The substrate 5 to be coated rests on the lower electrode 2. The upper electrode is bored, and provided with an upper sapphire window 6, to allow the passage of a laser light beam 7, serving to measure by interferometry the thickness of the film, when the substrate 5 is reflecting. On the left side of the equipment, a sapphire window 8 is provided for the purpose of measuring by spectroscopy the light emission of the discharge. The gaseous stream enters from 9, and its pressure is measured at 10. The line 11 leads to a conventional rotary vacuum pump, not shown. The radio frequency power generator 3 is of conventional type, provided with a system for calibrating or measuring the impedances, and with a power meter.

When the substrate 5 is not reflecting, the thickness of the film is determined by a gravimetric method.

The stoichiometry of polyfluorocarbon $(CF_x)_n$ is determined by XPS analysis. Preferably, a gaseous mixture of $C_2F_6$ and $H_2$, containing from 10 to 80% by volume of $H_2$, is used. Increasing amounts of $H_2$ in the mixture produce an increase in polymer crosslinking. With a $H_2$ percentage between 10 and 25%, a fluoropolymer $(CF_x)_n$ is obtained in which x ranges from 1.7 to 2.0. With a $H_2$ percentage between 30 and 80%, a fluoropolymer $(CF_x)_n$ is obtained in which x ranges from 0.3 to 1.4.

The rate of deposition of the polymer on the substrate varies as a function of the substrate temperature, of the pressure, and of the composition of the gaseous mixture. Low substrate temperatures, relatively high pressures, and $H_2$ percentage values in the mixture $C_2F_6$–$H_2$ within the range of from 20 to 60% favor high deposition rates. This rate may range from values close to 0, up to about 0.3–0.4 microns per minute.

The duration of the electrical discharge is generally within the range of from 2 to 20 minutes.

The following examples are given for the purpose of still better illustrating the inventive concept of the present invention.

EXAMPLE 1

The reactor used is shown in the accompanying drawing. The radio frequency electrical generator has a frequency of 27 MHz and a maximum power of 80 watts.

The electrodes are parallel and circular and have a diameter of 3 cm; the distance between the two electrodes is 3 cm. The upper electrode is connected to the current generator, the lower electrode is grounded.

The procedure is as follows:

(a) Thin plates of polished aluminum or of polytetrafluoroethylene have the following dimensions: 20×20×1 mm. They are washed inside an ultrasoundbath with various solvents (acetone, CCl$_4$, petroleum ether).

(b) The thin plates are placed on the lower electrode in the reactor. For aluminum, monitoring the film deposition rate is possible by laser interferometry: thus, the laser beam 7 is made to impinge against the substrate. The temperature of the electrode is controlled within the range of from 20° to 120° C.

(c) The composition and the total flow rate of the gaseous mixture is adjusted by rotameter-flowmeters. The pressure is controlled by a membrane valve interposed between the reactor and the rotary vacuum pump. The pressure is read by an MKS Baratron connected to and communicating with the reactor.

(d) The electrical discharge is turned on, and the impedance is so regulated that the reflected power is minimum and the direct power is maximum.

(e) The film growth of Al is monitored by the laser interferiometric trace on a recorder (not shown) connected to a photodiode. When the required thickness has been reached, or the desired time has elapsed, the electrical discharge is turned off.

(f) The film-coated substrates are removed from the reactor. The thickness of the polymeric film on the polytetrafluoroethylene plate is measured by a balance having an accuracy to the 6th decimal digit, the specific gravity of the deposited material being known.

(g) The XPS spectrum of the film on the plates allows the chemical structure of the coating to be determined. The adherence is measured by the "lap shear" method. The wettability is determined by measuring the contact angles with various solvents, and the valuke of $_c$ is obtained by graphic analysis, according to per se known procedure.

In this example, the support is Al. The gaseous mixture fed is 20% of $H_2$ and 80% of $C_2F_6$ by volukme. The total gaseous stream flow rate has the value of 30 cm$^3$ (STP) per minute. The pressure is 1 torr. The power supplied by the generator is 40 watts. The temperature of the substrate is 40° C. The discharge time is 5 minutes.

The coating obtained has a thickness of 1 micron. Its composition is $(CF_{1.8})_n$. The bonding strength of the film to the substrate is 50 kg/cm$^2$. Its $_c$ is 18 dynes.cm$^{-1}$.

EXAMPLE 2

The support is polytetrafluoroethylene. The gaseous mixture fed is 70% of $H_2$ and 30% of $C_2F_6$ by volume. The total gaseous stream flow rate has the value of 30 cm$^3$ (STP) per minute. The pressure is 1 torr. The power supplied by the generator is 60 watts. The temperature of the substrate is 40° C. The discharge time is 20 minutes.

The coating obtained has a thickness of 0.5 micron. Its composition is $(CF_{0.3})_n$. The $\gamma_c$ of the film is 34 dynes.cm$^{-1}$. The bonding strength of the film to the substrate is 20 kg/cm$^2$.

EXAMPLE 3

The support is polytetrafluoroethylene. The gaseous mixture fed is 50% of $H_2$ and 50% of $C_2F_6$ by volume. The total gaseous stream flow rate has the value of 30 cm$^3$ (STP) per minute. The pressure is 1 torr. The power supplied by the generator is 60 watts. The temperature of the substrate is 40° C. The discharge time is 10 minutes.

The coating obtained has a thickness of 0.7 micron. Its composition is $(CF_{0.7})_n$. The $\gamma_c$ of the film is 24 dynes.cm$^{-1}$. The bonding strength of the film to the substrate is 10 kg/cm$^2$.

EXAMPLE 4

The support is aluminum. The gaseous mixture fed is 20% of $H_2$ and 80% of $C_2F_6$ by volume. The total gaseous stream flow rate has the value of 30 cm$^3$ (STP) per minute. The pressure is 1 torr. The equipment is different from that of Example 1 as regards one detail only: the lower electrode is connected to the radio frequency generator. The power is 40 watts. The temperature of the substrate is 40C. The discharge time is 10 minutes.

The coating obtained has a thickness of 1 micron. Its composition is $(CF_{1.5})n_n$. The bonding strength of the film to the substrate is 50 kg/cm$^2$. Its $\gamma_c$ is 22 dynes/cm$^{-1}$.

EXAMPLE 5

The support is aluminum. The gaseous mixture fed is 80% of $H_2$ and 20% of $C_2F_6$ by volume. The total gaseous stream flow rate has the value of 30 cm$^3$ (STP) per minute. The pressure is 1 torr. The equipment is identical to that of Example 1. The power supplied by the generator is 80 watts. The temperature of the substrate is 100° C. The discharge time is 30 minutes.

The coating obtained has a thickness of 0.3 micron. Its composition is $(CF_{0.4})_n$. The bonding strength of the film to the substrate is 30 kg/cm$^2$. Its $\gamma_c$ is 34 dynes.cm$^{-1}$.

EXAMPLE 6

The support is polytetrafluoroethylene. The gaseous mixture fed is 20% of $H_2$ and 80% of $C_2F_6$ by volume. The total gaseous stream flow rate has the value of 30 cm$^3$ (STP) per minute. The pressure is 1 torr. The equipment is identical to that of Example 1. The power supplied by the generator is 60 watts. The temperature of the substrate is 40° C. The discharge time is 1 minute.

The coating obtaind has a thickness of 0.1 micron. Its composition is $(CF_2)_n$. The bonding strength of the film to the substrate is 50 kg/cm$^2$. Its $\gamma_c$ is 18 dynes.cm$^{-1}$.

What is claimed is:

1. Process for coating films, layers, tapes, plates, and similar structures of metal or plastic materials with a thin polyfluorocarbon film characterized in that no other materials are interposed; the polyfluorocarbon films are adherent and non-porous, and have controlled wettability characteristics; the polyfluorocarbons have the formula $(CF_x)_n$, where x is within the range of from 0.3 to 2.0, and are obtained directly on the substrate by the plasma-polymerization of gaseous streams of $C_2F_6$ and $H_2$; or $C_2F_6$ and $C_2F_4$; or $CF_4$ and $H_2$; or $CF_4$ and $C_2F_4$; or $C_2F_4$; and wherein in said process a gaseous stream of $C_2F_6$ and $H_2$; or $C_2F_6$ and $C_2F_4$; or $CF_4$ and $H_2$; or $CF_4$ and $C_2F_4$; or $C_2F_4$ is passed through a reactor provided with two electrodes, one of which is connected to a radio frequency current generator, and the other of which is connected to ground; the substrate is placed on one of the electrodes; the pressure of the gaseous stream is within the range of from 0.1 to 2 torr; a power densitiy of at least 1 watt/cm$^2$ is applied, the plasma being thus generated, and the consequent polymerization of the fluorocarbons being caused directly on the substrate, the temperature of which is maintained at values within the range of 20° to 120° C.

2. Process according to claim 1, characterized in that the power density is within the range of from 1 to 10 watts/cm$^2$.

3. Process accoding to claim 1 or claim 2, characterized in that the two electrodes are parallel to each other.

4. Process according to claim 1 or claim 2, characterized in that the temperature of the substrate is maintained at values within the range of from 40° to 100° C.

5. Process according to claim 1 or claim 2, characterized in that a gaseous stream of $C_2F_6$ and $H_2$ is used, the percentage of $H_2$ by volume being within the range of from 10 to 80%.

* * * * *